United States Patent [19]
Hanson et al.

[11] Patent Number: 5,920,764
[45] Date of Patent: Jul. 6, 1999

[54] PROCESS FOR RESTORING REJECTED WAFERS IN LINE FOR REUSE AS NEW

[75] Inventors: David R. Hanson, Brewster; Hance H. Huston, III, Fishkill; Kris V. Srikrishnan, Wappingers Falls, all of N.Y.

[73] Assignee: International Business Machines Corporation, Armonk, N.Y.

[21] Appl. No.: 08/940,723

[22] Filed: Sep. 30, 1997

[51] Int. Cl.$^6$ .................................................. H01L 21/00
[52] U.S. Cl. ........................ 438/4; 438/459; 438/460; 438/476; 438/928; 438/959; 438/977
[58] Field of Search ................. 438/4, 459, 460, 438/476, 928, 977, 959

[56] References Cited

U.S. PATENT DOCUMENTS

| | | |
|---|---|---|
| 3,559,281 | 2/1971 | Mayberry et al. ........................ 29/575 |
| 3,923,567 | 12/1975 | Lawrence ..................................... 156/7 |
| 4,062,102 | 12/1977 | Lawrence et al. ........................ 29/572 |
| 4,891,325 | 1/1990 | Hezel et al. ................................. 437/2 |
| 4,897,154 | 1/1990 | Chakravarti et al. . | |
| 5,131,979 | 7/1992 | Lawrence ................................. 156/655 |
| 5,198,371 | 3/1993 | Li . | |
| 5,374,564 | 12/1994 | Bruel . | |
| 5,510,277 | 4/1996 | Cunningham et al. . | |

OTHER PUBLICATIONS

A.J. Auberton–Hervé, "SOI: Materials to Systems", IEEE, pp. 1.1.1–1.1.8, (1996).

B.H. Lee et al., "A Novel Pattern Transfer for Bonded SOI Giga–bit DRAMs", 1996 IEEE Int'l. SOI Conference Proceedings, pp. 114–115, (Sep. 30–Oct. 3, 1996).

*Primary Examiner*—John F. Niebling
*Assistant Examiner*—David A. Zarneke
*Attorney, Agent, or Firm*—Ratner & Prestia; Tiffany L. Townsend

[57] ABSTRACT

A process applicable to the restoration of defective or rejected semiconductor wafers to a defect-free form uses etchants and a variation of the Smart-Cut® process. Because of the use of the variation on the Smart-Cut® process, diffusion regions are removed without significantly affecting the specifications of the semiconductor wafer. Therefore, a defective or rejected wafer can be restored to near original condition for use in semiconductor manufacturing.

14 Claims, 5 Drawing Sheets

| Etch Al metallization
Etch Silicon dioxide
Etch W metallization
Etch Ti metallization | — 410

| Etch Silicon Nitride
Etch gate electrode
Etch field/gate oxide | — 420

| Spin-on planar layer | — 430

| H2 implant | — 440

| Smart Anneal/Fracture | — 450

| Touch-up polish substrate | — 460

PROCESS FOR RESTORING REJECTED WAFERS IN LINE FOR REUSE AS NEW

FIELD OF THE INVENTION

The present invention relates in general to a process for the production of semiconductor wafers. In particular, the present invention describes a process for restoring defective or rejected wafers to a defect-free form for use in semiconductor manufacturing.

BACKGROUND OF THE INVENTION

The size of semiconductor wafers (hereinafter also referred to as silicon wafers) used in semiconductor manufacturing is increasing in order to fabricate more chips per wafer and reduce the cost per chip. For instance, most state-of-the art manufacturing lines use 200 mm wafers, instead of the 125 to 150 mm wafers common only a few years ago. There are plans underway to convert to 300 mm wafers. Correspondingly, the raw wafer cost has become significant.

There is a shortage in the silicon wafer supply and new fabrication lines are being set up to meet the demand. The silicon wafers desirably meet certain specifications, such as thickness, uniformity, electrical resistivity, oxygen concentration, and surface smoothness (at least on one side). During wafer processing, wafers are rejected when devices are out of specification or when there is a quality problem. A typical yield loss in which a full wafer is rejected for being out of specification is typically about 5 to 10%, whereas the loss on an individual chip basis is typically about 20% or higher. Such yield losses increase the cost of silicon wafers.

In device manufacturing, different doped layers and regions are formed by epitaxial deposition, implantation, diffusion, and annealing. Selected regions of oxides and layers of oxide are formed by thermal oxidation of silicon or by chemical vapor deposition. These process steps typically alter the top 1 to 2 $\mu$m of the silicon wafer. For wafers used in forming trench capacitors, narrow oxide-filled trenches often extend about 4 to 6 $\mu$m into the silicon. Patterned layers of conductors (metal, silicides, or polysilicon— hereafter collectively referred to as metal) and insulators are formed over the devices in order to complete the wiring.

A typical wafer used in semiconductor manufacturing has the following specifications: thickness is 725±20 $\mu$m; substrate resistance is between 5 and 10 mohms-cm; warp (unchucked) is less than 65 $\mu$m; global flatness is less than 5 $\mu$m; oxygen concentration is between 18 and 30 ppma; and fewer than 25 particles that are larger than 0.3 $\mu$m in size.

A cross section of a typical semiconductor structure (e.g., a complementary metal-oxide-semiconductor (CMOS) structure) is illustrated in FIG. 1. The structure has metal 12 and oxides (insulators) 14 deposited on the surface of a substrate 10 (semiconductor wafer). The p regions 17 and n regions 20 are typically formed by either implantation or diffusion into the substrate 10. These n and p device regions are confined to the surface layers and are typically less than about 1 to 2 $\mu$m thick. The topography formed by the metal and oxide depositions is typically less than 1 $\mu$m. Thus, a variety of implantations, diffusions, and depositions of different materials are made in and on a wafer substrate during processing.

Wafers can be rejected during device processing or during post-process device testing. Rejected wafers can have epitaxial layers, diffusions, contacts, gate conductors (such as polysilicon or polycides or metals), and insulators. Removal of these layers and depositions is required to restore a wafer to its original, defect-free condition.

When a wafer is rejected during processing, for reasons such as physical damage to layers, misprocessing, or electrical characteristics being outside a specification, the wafers are typically removed from further processing and are used for purposes other than making electrical chips. Many times, the defect is caused by equipment failure or equipment that is out of calibration. Sometimes, such as in resists or metal layers, the individual process step is reworked easily and the resulting layer becomes acceptable. A simple rework is not feasible, however, when more than one process step leads to an off-specification condition. In these cases, the wafer lot is typically discarded.

The prior art does not offer a technologically and economically feasible solution to restore wafers to their original, defect-free form. For example, it is difficult to selectively or controllably etch out the dopant regions because they are present not just as layers, but as regions within layers in association with oxide regions. The dopant regions are typically silicon with varying amounts of dopants. In CMOS wafers, a typical topography is about 1 $\mu$m at the end of device processing. This topography is created primarily by oxide isolation, gate electrode stack, or both. If the gate stack and isolation oxide are entirely removed, the wafer will still have some topography from the removal of isolation oxide because it is formed by in-situ conversion of silicon or by cutting a trench and filling it with oxide. Mechanically planarizing this substrate while removing the topography is difficult unless a large amount of silicon is removed by polishing. Such a polishing process is both difficult and expensive. For example, if more than one material is present, such as a gate electrode or an oxide along with silicon, polishing is very difficult because different materials polish very differently.

In practice, most rejected wafers are simply coated with a thick layer of plasma deposited oxide to insulate the substrate and are then used as a "line monitor." This is not an efficient use of the rejected wafers. Therefore, there is a need for a process that can remove the unwanted layers of the rejected wafers with a minimum loss of the wafer thickness. Such process steps need to be compatible with the silicon manufacturing process and preferably restore the rejected wafer to the new wafer specifications defining thickness, uniformity, and electrical values.

Although the art of semiconductor fabrication is well developed, there remain some problems inherent in this technology. One particular problem is restoring a rejected or defective semiconductor wafer to its original form. Therefore, a need exists for a method which restores semiconductor wafers that have been rejected during processing to their original new wafer specifications for future use in device manufacturing.

SUMMARY OF THE INVENTION

The present invention is directed to a process for restoring rejected semiconductor wafers to their original, detect-free form, thereby meeting their original specifications.

In the present invention, a method of forming a semiconductor substrate portion upon which semiconductor structures can be subsequently formed, comprises the steps of providing a wafer with a semiconductor substrate, the semiconductor substrate having at least one of a metal portion and an oxide portion and at least a diffusion region; removing the at least one of the metal portion and the oxide portion; implanting ions into the semiconductor substrate to form a buried layer therein, the buried layer being deeper than the diffusion region; heating the wafer to a temperature; and separating the wafer along the buried layer to remove a top surface layer of the wafer, whereby underlying portions of the wafer remain to form the semiconductor substrate portion.

In the present invention, etchants are used to remove the metal portions and oxide portions, and ultrasonic agitation is used to separate the wafer along the buried layer.

Another embodiment within the scope of this invention includes the steps of planarizing the semiconductor wafer prior to the step of implanting ions, and polishing the semiconductor substrate portion after the step of separating.

The foregoing and other aspects of the present invention will become apparent from the following detailed description of the invention when considered in conjunction with the accompanying drawing.

DESCRIPTION OF THE DRAWING

FIG. 5 shows a process flow diagram of a further exemplary fabrication process in accordance with the present invention.

DESCRIPTION OF EXEMPLARY EMBODIMENTS AND BEST MODE

Figure 1:
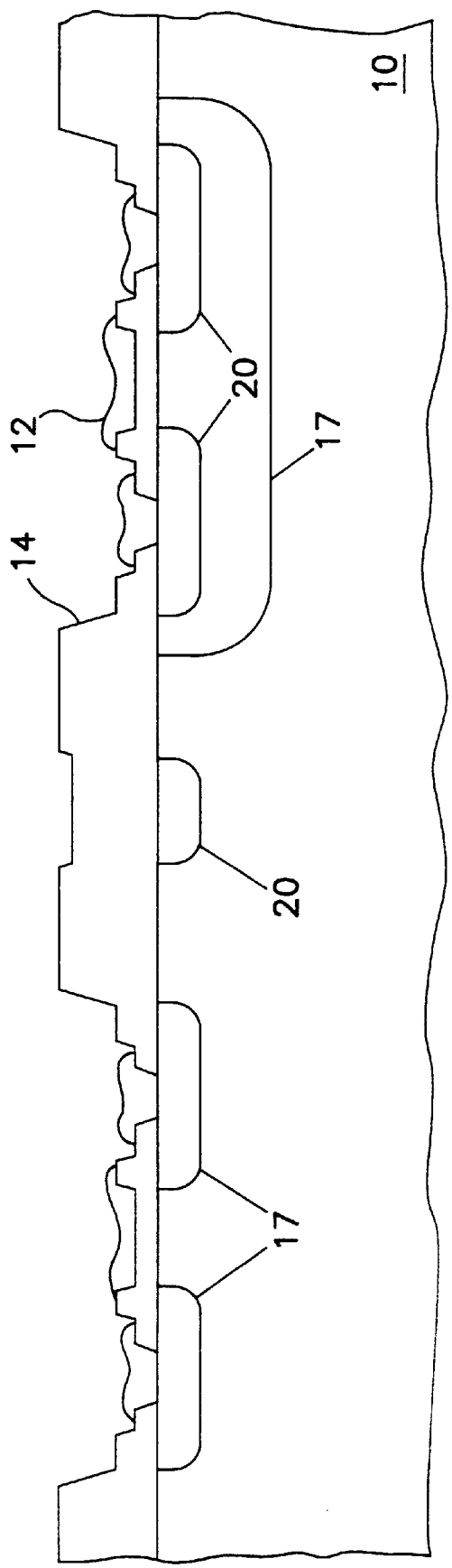
FIG. 1 is a cross section of a typical CMOS device showing various material depositions, diffusion regions, and implantation regions.

The present invention is directed to removing unwanted layers of a processed, rejected silicon wafer in manufacturing so that the wafer has approximately the same characteristics as that of an original, new wafer. The unwanted layers in a rejected wafer typically consist of epitaxial films and dopant regions, conductors and insulators used for electrodes, local and global interconnection of the devices, and insulating films to isolate and passivate conductors. A wafer is characterized as rejected if it contains defects, does not meet specifications, or does not have an adequate yield, and the rejection can occur at any of the processing or testing steps.

The present invention is directed to removing a layer of a silicon device containing dopant regions and epitaxial layers to a near uniform depth, using hydrogen implantation and annealing. Upon annealing, brittle silicon-hydrogen phases are formed and the silicon body separates along this region. In this regard, the present invention uses some of the steps of the Smart-Cut® process for making a silicon-on-insulator bonded wafer and applies those steps to the task of restoring rejected wafers.

The process in accordance with the present invention removes metals and insulators (e.g., oxides) from a semiconductor wafer using chemical etchants. The stripping removes all layers of metal, silicon dioxide ($SiO_2$), and silicon nitride (SiN). Chemicals for removing these layers are well known in the industry. For example, to remove all exposed doped and undoped silicon dioxide, a dilute buffered hydrofluoric (BHF) solution can be used. To remove aluminum (Al) and Al alloys, a hot phosphoric solution can be used. Silicon nitride is typically on the surface of a device wafer and does not etch in BHF or hot phosphoric acid and remains in place. Silicides and polysilicon can be etched in chemicals that are selective to the surface and oxide layers. If desired, the silicide stack (typically on the order of about 3000 to 5000 Å) can be left on.

In a preferred embodiment, a highly planarizing layer of spin-on-glass, reflow glass (e.g., boric oxide), or an organic material is used, in a thickness range of 1000 to 5000 Å, to obtain a flat surface. After the planarizing layer is deposited as a leveling layer, the wafer has a nearly flat surface. Underneath the flat surface, the wafer top layer has epitaxially deposited films with impurity regions. This top layer is usually of the order of 1 to 2 μm in the case of wafers used for CMOS and dynamic random access memory (DRAM) applications. In the case of DRAMs using trench capacitors, however, the capacitor region typically extends 4 to 6 μm deep into the silicon body, and has a polysilicon central electrode and oxide/nitride node dielectric.

In the present invention, the top silicon body layers containing the diffusions and buried oxides (less than 1 μm) are cut away by use of a process similar to the conventional Smart-Cut® process. Because the diffusions are usually limited to a thin top surface layer, the present invention removes the entire slab, which makes the wafer equivalent to new for manufacturing. In the Smart-Cut® process, hydrogen ions are implanted at a certain depth (about 5000 Å to 3 μm) depending on the implant energy and current. This layer of buried hydrogen implant forms microvoids which link up when heated. In the present invention, using ultrasonic agitation or other means, the slab layer defined by the depth of hydrogen implant is cleanly fractured, thereby removing with it the unwanted diffusions, silicides, and the planarizing layer. The wafer is then subjected to a touch-up polish which removes the micro roughness caused by the microvoid interface, thereby restoring smoothness to specification. If required, the process of implantation, heating, and fracture can be repeated to remove thicker layers or the depth of implantation can be increased. In the case of DRAM wafers with buried capacitors, the process can be repeated until the top 5 to 6 μm are removed.

Figure 2:
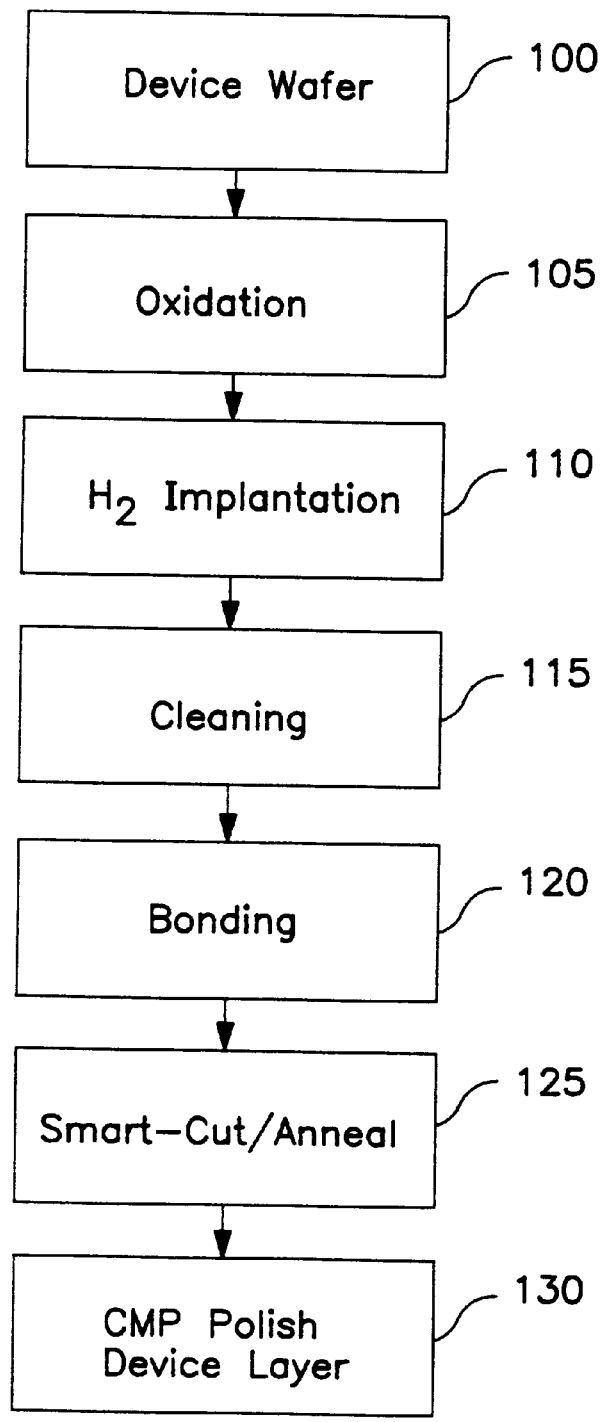
FIG. 2 shows a process flow diagram of a conventional Smart-Cut® process.
Figure 3A:
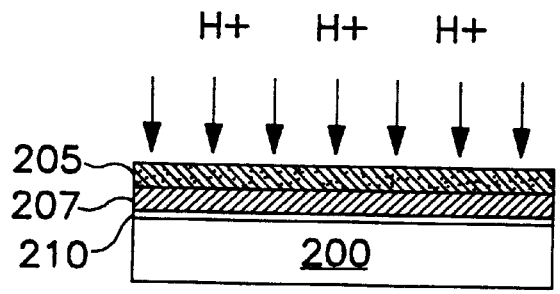
FIGS. 3A to 3C show side views of a conventional wafer as fabricated in accordance with the process of FIG. 2.
Figure 3B:
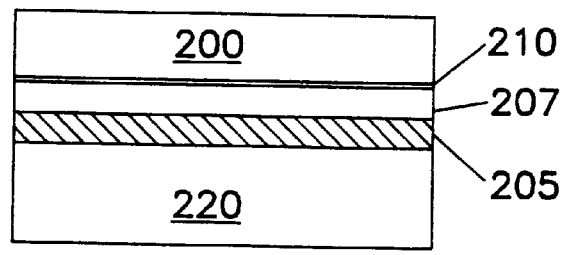
Figure 3C:
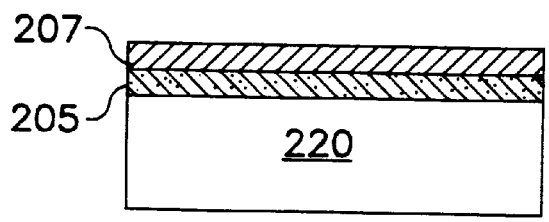

FIG. 2 is a flow diagram of the process steps for forming a silicon-on-insulator (SOI) substrate using the Smart-Cut® process. The Smart-Cut® process is described in U.S. Pat. No. 5,374,564, which is hereby incorporated by reference for its teachings on the Smart-Cut® process. FIGS. 3A to 3C are diagrams that illustrate the steps in FIG. 2. A device quality wafer 200 is provided at step 100. The wafer surface is oxidized at step 105 so that it is capped or buffered with a thermally grown $SiO_2$ layer 205 (i.e., a dielectric layer). The dielectric layer 205 becomes the buried oxide of the SOI structure. Hydrogen ions are implanted at 50 to 150 KeV at step 110 with a dosage of $2\times10^{16}$ to $1\times10^{17}$ ions/cm$^2$ to form a hydrogen-rich layer 210 about 0.5 to 1 μm below the top surface, as shown in FIG. 3A. The thin silicon layer that will be the device layer is shown as layer 207.

The device wafer 200 and a supporting substrate (a nonimplanted handle wafer) 220 are cleaned in step 115 using conventional cleaning techniques such as the RCA wafer cleaning procedure. The surfaces of the device wafer 200 and the supporting substrate 220 are made hydrophilic and are bonded together at room temperature in step 120, as shown in FIG. 3B. The supporting substrate 220 acts as a stiffener and provides the bulk silicon under the buried oxide in the SOI structure.

A two-phase heat treatment is applied to the two bonded wafers 200 and 220. In step 125, the bonded wafers 200 and 220 are annealed to about 400 to 600° C., which promotes the formation and linkage of regions of brittle silicon hydride. When the hydride regions are completely linked across the wafer, the device wafer 200 is fractured and separated from the bonded stack along the hydride rich plane. The thin silicon layer 207 remains bonded to the support substrate 220, as shown in FIG. 3C. Then, the support substrate 220 with the thin silicon layer 207 (device layer) still bonded to it is annealed at a high temperature (approximately 1000° C.) to promote a stronger bonding between the support substrate 220 and the device layer 207. After splitting, the separated surface of the device usually has a roughness on the order of a few hundred angstroms. A chemical-mechanical polishing (CMP) is carried out at step 130 to reduce the roughness of the surface.

In the present invention, the Smart-Cut® concept of forming a silicon hydride layer as a means to fracture silicon is used but the starting topography of the surface requires additional process steps. Also, a supporting substrate (a nonimplanted handle wafer) is not used.

Figure 4:
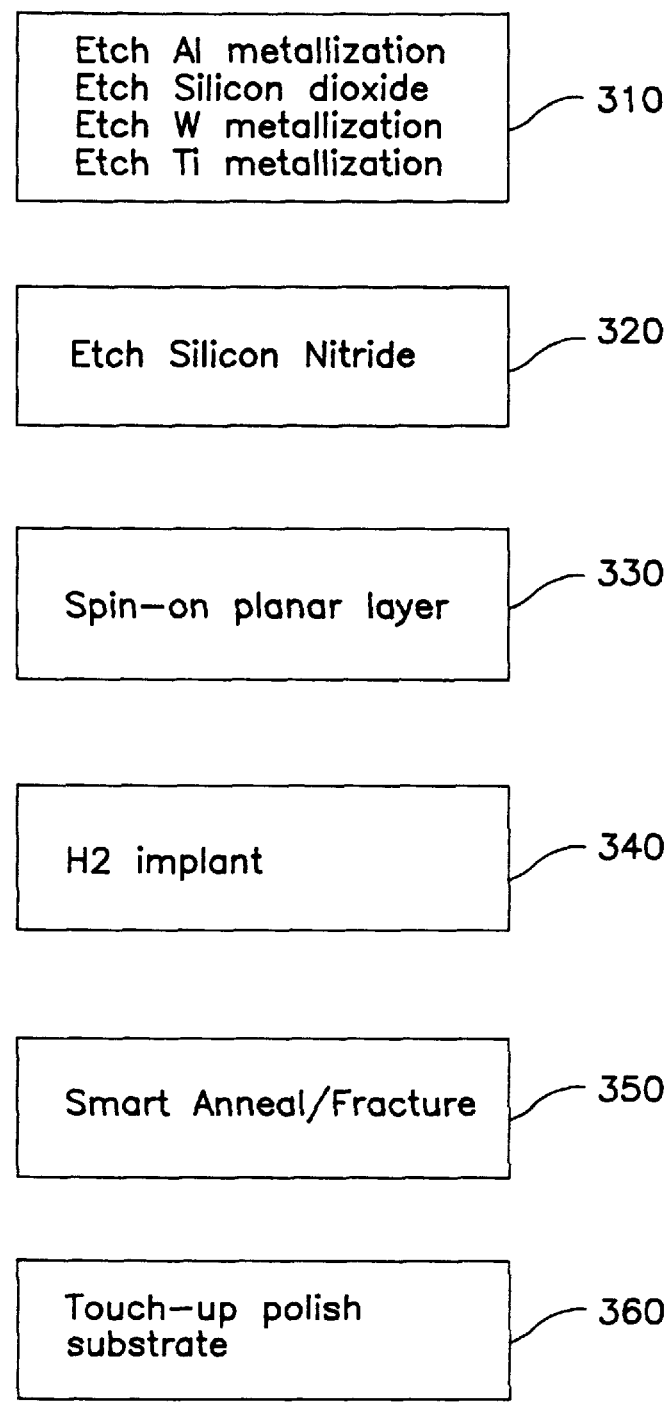
FIG. 4 shows a process flow diagram of an exemplary fabrication process in accordance with the present invention.

FIG. 4 shows the process steps of a first exemplary embodiment of the present invention. In this exemplary embodiment, it was assumed that the rejected wafer has a silicon nitride layer present above the device regions and over the gate electrode. The rejected wafer, in addition to having device regions similar to those shown in FIG. 1, can have a varying number of interconnection layers, such as aluminum wire, doped and undoped deposited oxides, tungsten (W) studs, silicides, and the like. Aluminum can be etched rapidly in a hot solution (about 35 to 45° C.) of 80% phosphoric, 5% nitric, 5% acetic acid, and 10% water at rates of 1000 to 3000 Å/min or any other conventional etchant. A 6:1 buffered HF etches $SiO_2$ at a rate of 1000 Å/min at 25° C. Silicon nitride is etched using 85% phosphoric acid at 180° C. (reflux boiling), which is selective to silicon and silicon dioxide. The above etchants are selective to oxides and silicon. Silicon dioxide can be etched in hydrofluoric acid (different dilution) and selective silicon. Similarly, etchants for W and suicides are available. Many alternate conventional etchants are readily available and known to those skilled in the art for these and other materials.

As shown in step 310, the layers above SiN are etched sequentially to remove both metal and oxide layers above SiN. Between different etches, the wafers are cleaned, rinsed and dried to avoid cross contamination between different wet chemicals. Subsequently, as shown in step 320, silicon nitride (if present) is removed selective to silicon, silicon dioxide, and gate electrodes. The typical topography is about 5000 to 7500 Å above an imaginary planar surface. In this embodiment, there is no removal of gate stack or silicon dioxide isolation regions. If one assumes an imaginary plane as the original wafer surface prior to formation of isolation and gate stacks, then the diffusion regions, n- and p-well regions, and the device regions contained therein (including isolation regions) extend to within 1 $\mu$m below this imaginary plane. About 2000 to 3000 Å of spin-on-glass or an organic layer such as polyester which has an excellent planarizing property is used to coat the wafer surface at step 330 to minimize the topography to below 2500 Å.

The wafer is then subjected to a process similar to the Smart-Cut® process in steps 340 and 350. As shown in step 340, hydrogen is implanted at a preferred energy of about 150 to 200 KeV at a preferred dosage of about $2 \times 10^6$ to $1 \times 10^7$ ions/cm$^2$, to form a hydrogen rich layer about 1 to 2 $\mu$m below the surface and also below the isolation oxide region. At step 350, the wafer is annealed at a temperature preferably in the range between 400 and 600° C., and more preferably at about 500° C., for 30–120 minutes to convert the hydrogen into silicon hydride. The plane of the silicon hydride separates the silicon wafer into a bulk silicon to be preserved and a thinner surface silicon which is to be discarded. When the hydride regions are linked up, the separation occurs by brittle fracture. If desired, the wafer is immersed in an ultrasonically agitated bath to help dislodge the thin surface layer. The wafer at this point is characterized by a topography of about 2000 to 3000 Å which roughly corresponds to the spin-on planarizing layer, and the topography and roughness are now in a homogeneous silicon region and there is no oxide or other inorganic material.

At step 360, the wafer is polished to achieve surface smoothness using conventional silicon polishing methods and is homogenized and heat treated to uniformly distribute the dopants and to form oxygen clusters. The thickness of the restored "bulk silicon" is within about 1 to 2 $\mu$m of the original silicon wafer used for forming devices. Thus, the restored wafers are within the thickness specification of a "new" silicon wafer. Any dopants from the remaining n-well or p-well regions will be diffused, on heating, into the bulk silicon with no measurable change to the bulk silicon resistivity or dopant concentration of a "new" silicon wafer. Thus, a rejected wafer is fully restored to an equivalent-to-new condition.

A second exemplary embodiment of the present invention is described with respect to FIG. 5. In this embodiment, all materials except silicon are removed, including nitride, oxide, and gate electrodes. Referring to step 410 in FIG. 5, the process step is identical to step 310 of FIG. 4 and its description is omitted for brevity. In step 420, all other layers including silicon nitride, gate oxide, gate silicide, and isolation oxides are removed to strip the structure down to a bare silicon. The wafer at this point contains a silicon substrate with different dopant regions and depressions corresponding to recessed oxide (ROX or trench) isolations. A thin spin-on planarizing layer is used to fill in all the depressions in step 430. This is followed by hydrogen implant in step 440 and the follow-on steps 450 and 460 which are similar to those described with respect to steps 340, 350, and 360 in FIG. 4, thus restoring a rejected wafer to an equivalent to new condition.

Thus, because of the present invention, the restored wafers are as good as new for use in manufacturing.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A method of forming a substrate portion comprising the steps of:

providing a wafer comprising a substrate, said substrate having at least one of a metal portion and an oxide portion and at least a diffusion region;

removing the at least one of the metal portion and the oxide portion;

implanting ions into said substrate to form a buried layer therein, said buried layer being deeper than said diffusion region;

heating said wafer to a temperature; and separating said wafer along said buried layer to remove a top surface layer of said wafer, whereby underlying portions of said wafer remain to form said substrate portion.

2. The method according to claim 1, further comprising the step of planarizing the wafer prior to the step of implanting ions.

3. The method according to claim 2, wherein the step of planarizing includes depositing a leveling layer.

4. The method according to claim 3, wherein said leveling layer comprises spin-on-glass.

5. The method according to claim 1, further comprising the step of polishing said substrate portion after the step of separating.

6. The method according to claim 1, wherein the step of removing the at least one of the metal portion and the oxide portion includes etching using at least one etchant.

7. The method according to claim 6, wherein said at least one etchant is selected from the group consisting of a buffered hydrofluoric solution and a phosphoric solution.

8. The method according to claim 1, wherein the step of separating includes ultrasonic agitation.

9. The method according to claim 1, wherein the substrate is silicon.

10. The method according to claim 9, wherein said ions comprise hydrogen ions such that said buried layer is comprised of hydrogen and silicon.

11. The method according to claim 10, wherein said hydrogen ions are implanted at a dose in the range between about $2\times10^{16}$ and $10^{17}$ ions/cm$^2$ with an energy in the range between 150 and 200 KeV.

12. The method according to claim 1, wherein said step of heating includes annealing at a range between about 400 and 600° C., for a time in the range between about 30 and 120 minutes.

13. The method according to claim 1, wherein said buried layer is formed at a depth between 1 and 2 $\mu$m beneath the top surface of said wafer.

14. A method of forming a semiconductor substrate portion upon which semiconductor structures can be subsequently formed, comprising the steps of:

providing a wafer comprising a semiconductor substrate, said semiconductor substrate having at least one of a metal portion and an oxide portion and at least a diffusion region;

removing the at least one of the metal portion and the oxide portion;

planarizing the semiconductor wafer;

implanting hydrogen ions into said semiconductor substrate to form a buried layer therein, said buried layer being deeper than said diffusion region;

heating said wafer to a temperature;

separating said wafer along said buried layer to remove a top surface layer of said wafer; and polishing said semiconductor substrate portion after the step of separating, whereby underlying portions of said wafer remain to form said semiconductor substrate portion.

* * * * *